United States Patent [19]
Goodrich et al.

[11] Patent Number: 5,343,070
[45] Date of Patent: Aug. 30, 1994

[54] MESA TYPE PIN DIODE

[75] Inventors: Joel L. Goodrich, Westford; Christopher C. Souchuns, Ashland, both of Mass.

[73] Assignee: M/A-COM, Inc., Lowell, Mass.

[21] Appl. No.: 101,893

[22] Filed: Aug. 2, 1993

Related U.S. Application Data

[62] Division of Ser. No. 981,278, Nov. 25, 1992, Pat. No. 5,268,310.

[51] Int. Cl.⁵ .................. H01L 29/06; H01L 29/12
[52] U.S. Cl. .................. 257/594; 257/623; 257/624; 257/626; 257/656
[58] Field of Search ............. 257/594, 623, 624, 626, 257/656

[56]           References Cited
         U.S. PATENT DOCUMENTS

| | | | |
|---|---|---|---|
| 4,051,507 | 9/1977 | Rosvold | 257/656 |
| 4,255,757 | 3/1981 | Hikin | 257/656 |
| 4,561,007 | 12/1985 | Webb | 257/623 |

*Primary Examiner*—Ngan Van Ngo
*Attorney, Agent, or Firm*—Hayes, Soloway, Hennessey, Grossman & Hage

[57]                ABSTRACT

A mesa-type PIN diode and method for making same are disclosed. A diode made according to the present invention includes a junction formed in the top surface of the mesa-shaped structure, having an area that is less than (and preferably, approximately half) the area of the top surface. A highly-doped, N-type conducting layer is formed in the side-walls of the mesa-shaped structure. The resulting diode is subject to greatly reduced charge carrier recombination effects and suffers from much less carrier-to-carrier scattering than conventional diodes. Thus, a diode made according to the present invention is capable of achieving much higher stored charge, lower resistance, lower capacitance, better switching characteristics, and lower power consumption than one made according to the prior art. Particular utility is found, inter alia, in the areas of high-frequency microwave and monolithic circuits.

14 Claims, 6 Drawing Sheets

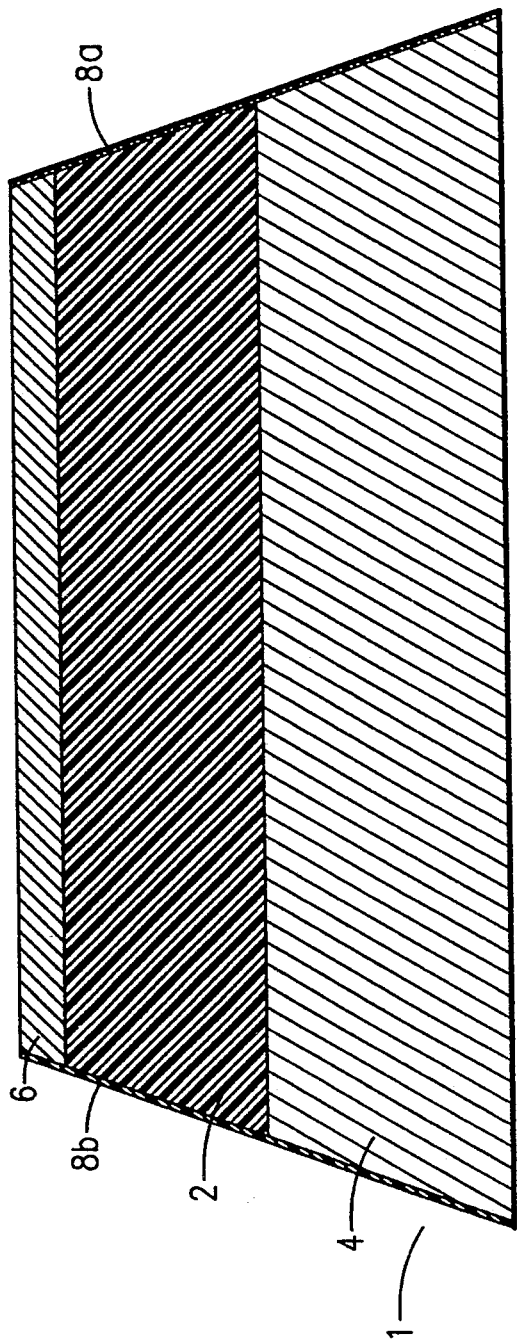
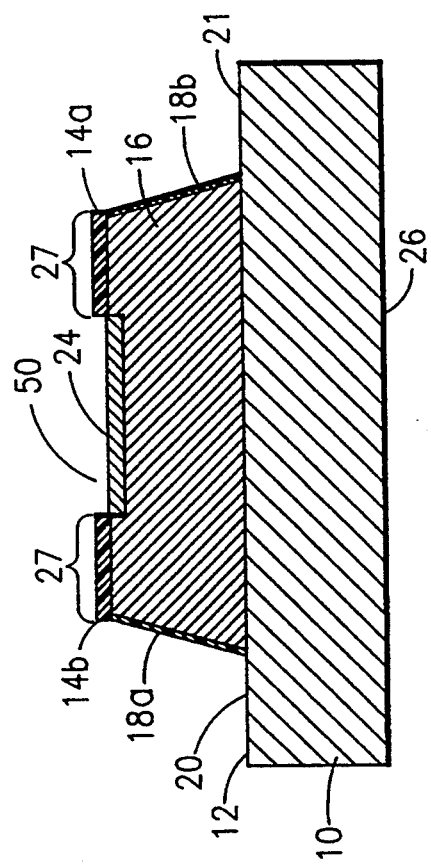
FIG.1
Prior Art
FIG.2

MESA TYPE PIN DIODE

This is a divisional of copending application Ser. No. 07/981,278 filed on Nov. 25, 1992, now U.S. Pat. No. 5,268,310, issued on Dec. 7, 1992.

FIELD OF THE INVENTION

The present invention relates generally to semi-conductor devices and methods for making same, and more specifically, it is related to a mesa-type semi-conductor PIN diode and method of fabricating same.

BACKGROUND OF THE PERTINENT PRIOR ART

Mesa-type PIN diodes are used, for example, in monolithic microwave circuits, attenuators, and other electronic devices requiring excellent high frequency and switching characteristics. A typical mesa-type silicon PIN diode structure is shown in FIG. 1.

In such a structure, a layer of intrinsic material 2 is sandwiched between two layers of opposite conductivity 6, 4. As is known in the art, the top-most layer 6 typically is of P-type conductivity while the bottom layer or substrate layer 4 is of N-type conductivity. The cross-sectional area of the diode 1 taken along the plane of the N-layer 4 decreases from the N-layer 4 to the P-layer 6. Thus, this produces a shape resembling a top-truncated frustrum of a cone or a mesa-like shape. To passivate the junctions, the side-walls of intrinsic layer intrinsic layer 4 typically are coated with a silicon dioxide layer 8A, 8B.

As is well known to those skilled in the art, in such a diode, the intrinsic region 2, has a resistance $R_I$ which, in order to improve the switching characteristics of the device and decrease its power consumption, must be minimized, and which may be computed by using the following equation taken from White, *Semiconductor Control*, Artech House, 1978, page 64:

$$R_{Ia} \frac{W_I^2}{2uQ_S} \quad (A)$$

wherein, the I-region thickness is given by $W_I$, charge-carrier mobility is given by u, and the stored charge is denoted by $Q_S$. Ordinary product design constraints cause $W_I$ to be predetermined, and therefore, effectively the only factor which may be varied to effect the intrinsic region's resistance is the stored charge of the device, $Q_S$. The stored charge of the device may be expressed as:

$$Q_s = It \quad (B)$$

wherein, I denotes the forward current through the device and t denotes the carrier lifetime in the intrinsic region. By substituting Equation (B) into Equation (A), the resulting equation demonstrates that the carrier lifetime of the device, t, effectively controls its forward resistance, since the current applied to the device may be considered as constant. Therefore, it becomes apparent that the most effective way to minimize the resistance of the intrinsic region 2 is to maximize its carrier lifetime. Accordingly, in order to maximize carrier lifetime through the intrinsic region, the stored charge, $Q_s$, of the device must be made as large as possible.

Unfortunately however, the stored charge of a typical mesa-type PIN diode, like the one shown in FIG. 1, is quite low, on the order of 100 pico-coulombs at a current of 10 milliAmps. Primarily, this is due to two phenomena.

First, the charge stored in the device 1 is reduced through Shockley-Read-Hall (SRH) charge-carrier recombination effects. SRH recombination is manifested by the formation of carrier trap levels at or near the $SiO_2$ passivation layer of the side-walls 8A, 8B and the doped silicon regions 2, 4, 6 of the device. SRH effects result from the large amount of active surface area exposed to oxidation. Second, when the diode is subjected to periods or conditions of high current density, stored charge is further reduced by Auger charge-carrier scattering effects. Of particular importance to the instant invention, it has been found that large surface area occupied by the P junction 6 atop the mesa (occupying the mesa's entire top surface area) relative to the overall volume of the intrinsic region 4 decreases the amount of charge which may be stored in the intrinsic region 4 of the device 1 through phenomena of either or both of the foregoing effects.

OBJECTS OF THE INVENTION

It is therefore a general object of the present invention to provide a semi-conductor PIN diode of mesa structure which overcomes the aforesaid and other disadvantages of the prior art, and which is capable of maintaining a high quantity of stored charge while exhibiting minimal capacitance.

A more specific object of the present invention is to provide a semi-conductor PIN diode of mesa structure in which charge-carrier recombination and scattering effects are minimized.

Yet another object of the present invention is to provide a new and improved method for fabricating a semi-conductor PIN diode of mesa structure which is capable of maintaining a high quantity of stored charge while exhibiting minimal capacitance.

SUMMARY OF THE INVENTION

Accordingly, in one aspect of the present invention, a semi-conductor PIN diode is provided which is mesa-shaped and comprises a substrate having N-type conductivity upon which is deposited an intrinsic material layer. A junction having a P-type conductivity is formed in the top surface of the intrinsic layer and has a predetermined area that is smaller than and may be, preferrably, essentially half the area of the top surface. Advantageously, it has been found that keeping the P-junction's area to less than (and preferrably, essentially half) the area of the top surface area in accordance with the present invention, reduces carrier-to-carrier scattering associated with the Auger recombination effect, by increasing the total intrinsic region volume while keeping the P-junction's surface area constant. Additionally, capacitance is almost unchanged. Further advantageously, this arrangement causes most of the device's current flow to be away from its side-walls and trap levels, thus greatly reducing SRH recombination effects. Also, according to the present invention, a N-type conducting layer is provided which covers the side-walls of the device. Preferably, the passivation layer is N-type and highly doped, e.g. with phosphorus. This permits the surface area of the device exposed to oxidation to be reduced. It also increases the total intrinsic region's volume while keeping the junction area relatively constant. Due to the small peripheral active surface area that is exposed to oxidation, the lower current density flowing through the intrinsic region, and the high quality of the passivation layer, a PIN diode made according to the present invention exhibits much higher stored charge characteristics than conventional devices. Advantageously, this high stored charge reduces the resistance, increases the switching agility, and reduces the power consumption of a device according to the present invention over those of the prior art.

A second aspect of the present invention provides a method for fabricating a semi-conductor PIN diode. The overall method is as follows: First, an insulating layer is formed on an intrinsic layer deposited upon a substrate having an N-type conductivity. An opening to a first region of the intrinsic layer is then formed in the insulating layer and a junction of P-type conductivity having a predetermined area is formed in the first region. A dielectric layer is formed on the insulating layer and the junction. A dielectric pad region is then formed by removing the dielectric layer and the insulating layer not located in a second region that is itself located on and surrounding the junction. The dielectric pad region is formed such that it has substantially greater (and preferrably, twice) the predetermined area of the junction. A mesa having side-walls and a top surface is then formed in the intrinsic layer beneath the pad region, a conducting layer is applied to the side-walls of the mesa, and the dielectric layer is then removed from the second region.

Other features and advantages of the present invention will become apparent as the following description proceeds and upon reference to the drawings, wherein like numerals depict like parts and in which:

BRIEF DESCRIPTION OF THE DRAWINGS

FIG. 1 illustrates a side cross-sectional view, not drawn to scale, of the structure of a conventional mesa-type PIN diode;

FIG. 2 is a side cross-sectional view, also not drawn to scale, of the structure of one embodiment of a diode made according to the present invention;

While the present invention will hereinafter be described in connection with preferred embodiments thereof, it will be understood that it is not intended to limit the invention to these embodiments. On the contrary, it is intended to cover all alternative, modifications, and equivalents as may be included within the spirit and broad scope of the invention as defined only by the appended claims.

DETAILED DESCRIPTION OF PREFERRED EMBODIMENTS

Figure 4:
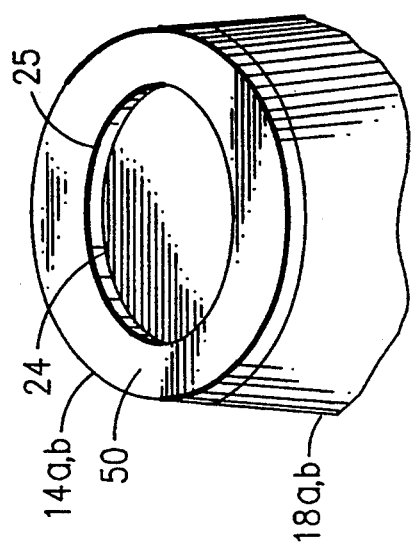
FIG. 4 is a side elevational view of the embodiment depicted in FIGS. 2-3.
Figure 3:
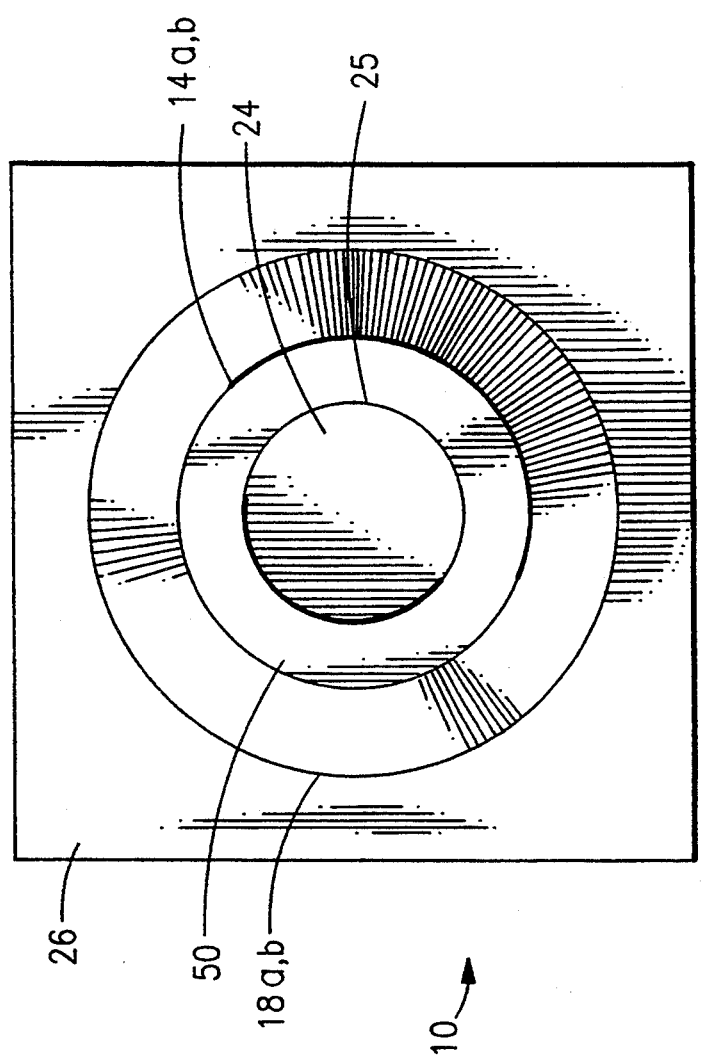
FIG. 3 is a top view of the embodiment illustrated in FIG. 2.

FIGS. 2-4, show a preferred embodiment of a diode made according to the instant invention, referred to generally by numeral 10. As depicted in FIG. 2, a semiconductor PIN diode made according to the instant invention comprises a substrate having an N-type conductivity. Preferably, this conductivity results from the predetermined doping of the substrate with selected ions, as is well known in the art. By way of illustrative example, the doping of the substrate 26 may be formed by melting silicon and mixing the molten silicon with arsenic to a concentration of, typically about $2 \times 10^{19}$ arsenic atoms/cm$^3$ and then solidifying the melt. Of course, many other methods may be used to dope the substrate 26, so long as the substrate formed is of an N-type conductivity and the charge carrier concentration is greater than about $10^{19}$/cm$^3$. On one surface 12 of the substrate 26 there is formed an intrinsic material mesa-shaped structure 16 that includes a top surface 50 and side-walls 18A, 18B. Preferably, this mesa-shaped structure takes the shape of a truncated frustrum of a cone, as is shown in FIG. 2 and is made of intrinsic semi-conductor, preferably silicon.

The side-walls 18A, 18B of the intrinsic material mesa 16 are highly doped N-type conductivity semi-conductor. Preferably, the N-type dopant is phosphorus and has a concentration of about $10^{20}$ atoms per cubic cm, although it will be appreciated that other N-type dopants may be used without departing from the present invention, and the charge carrier concentration in the side-walls 18A, 18B may vary between about $10^{18}$ atoms/cm$^3$ and about $10^{21}$ atoms/cm$^3$. Advantageously, the N-doping of the intrinsic mesa side-walls 18A, 18B reduces SRH recombination effects by reducing the overall device silicon surface area that is exposed to oxidation. Thus, it will be appreciated that other N-type dopant concentrations may be used, so long as SRH charge carrier recombination effects due to traps are significantly reduced.

At the top surface 50 of the intrinsic material mesa 16 there is formed a P-junction 24. According to the present invention, the surface area of the junction 24 is predetermined so as to occupy an area substantially smaller than (and in the preferred embodiment, approximately half) the total surface area of the top surface 50 of the mesa 16. Preferably, the P junction is doped with boron to a concentration of about $2 \times 10^{19}$ atoms/cm$^3$; however other P-type conductivity dopants may be used to form the junction, and the concentration of these dopants may vary, so long as the doping concentration is greater than about $10^{19}$ atoms/cm$^3$.

Also grown or deposed on the top surface 50 of the mesa 16 and surrounding the junction 24, are insulating areas 14A, 14B. Preferably, areas 14A, 14B are made of silicon dioxide.

Advantageously, the diode structure of the present invention, greatly reduces Auger high-current density/-charge-carrier scattering effects by increasing the total volume of the intrinsic region 16 relative to the surface area consumed by the active junction 24. Thus, the present invention makes possible the provision of a PIN diode that is capable of achieving higher stored charge, lower resistance, lower capacitance and lower power consumption, than is possible with the prior art PIN diodes.

Figure 5:
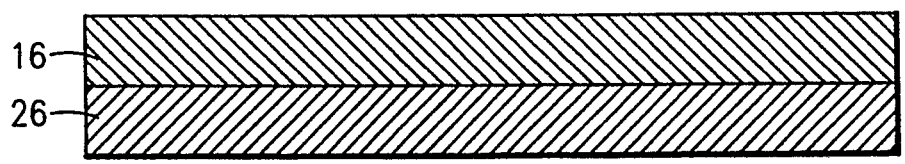
FIGS. 5-13 illustrate various stages in the formation of a diode according to the present invention.
Figure 6:
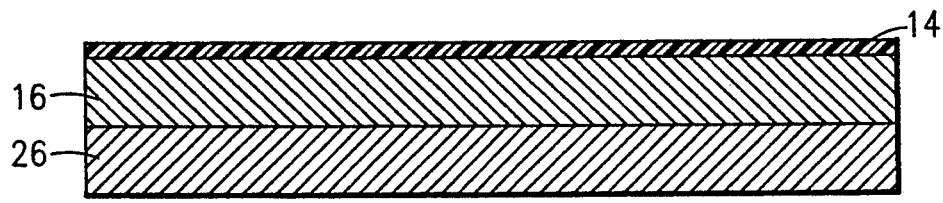

Turning now to FIGS. 5–13, there is illustrated a preferred method for fabricating a PIN diode according to the present invention. Starting with an N-type substrate having an intrinsic semi-conductor layer (preferably, silicon) preferably epitaxially deposed upon it (as shown in FIG. 5), a layer of insulating material 14 is formed on the upper surface of the intrinsic material layer 16. Preferably, the insulating layer has a thickness between about 2000 and about 3000 angstroms and may be formed by any conventional method, for example, by oxidation in a furnace or reactor, or by local oxidation of the semi-conductor substrate.

Figure 7:
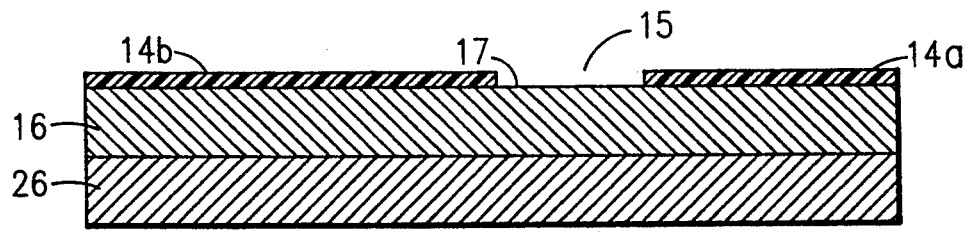

Referring in particular to FIG. 7, an opening 15 is then formed in the insulating layer to a first region 17 of the intrinsic layer 16. Opening 15 segments the insulating layer 14 into two half segments 14A, 14B. Any conventional method may be used to provide this opening, for example, a positive photoresist mask may be applied to the surface of the insulating layer 14. The photoresist mask may then be etched and the opening may then be formed. The removal of the mask may then be effectuated through the use of wet chemistry and/or the application of plasma.

Figure 8:
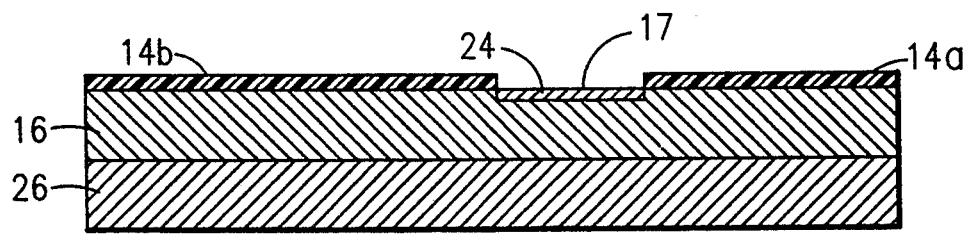

Referring to FIG. 8, a P-type junction 24 of a predetermined area then formed in the first region 17 located in between the two insulating segments 14A, 14B. Preferably, the formation of the P junction is accomplished by a low energy, high dosage application and implantation of boron. For example, boron ions may be applied to the first region 17 at an energy of about 32 KeV and at a concentration of about $4 \times 10^{15}$ atoms per square centimeter to produce a junction having a charge carrier concentration of greater than about $10^{19}$ atoms/cm$^3$. Of course, this example is only meant to illustrate a preferred way of accomplishing the formation of the P-junction, and many alternatives are possible without departing from the present invention.

Figure 9:
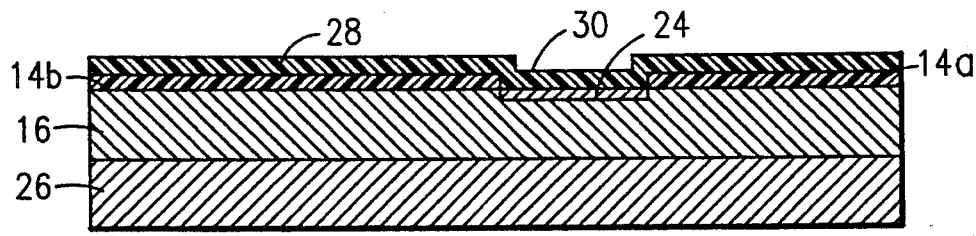

Turning now to FIG. 9, after the formation of the P-junction 24 in the first region 17, a layer of dielectric material 28 is deposited over the surface of the segments of the insulating layer 14A, B and the junction 24. This forms a depressed region over the junction 24. Preferably, dielectric layer 28 is of a $Si_3N_4$ composition and has a thickness of about 1500 angstroms, but may vary between about 1000 angstroms and about 3000 angstroms. Alternative materials and methods for forming the dielectric layer may be used without departing from the present invention. For example, an oxide layer may be deposited or grown onto the segments of the insulating layer 14A, 14B and the junction 24.

Figure 10:
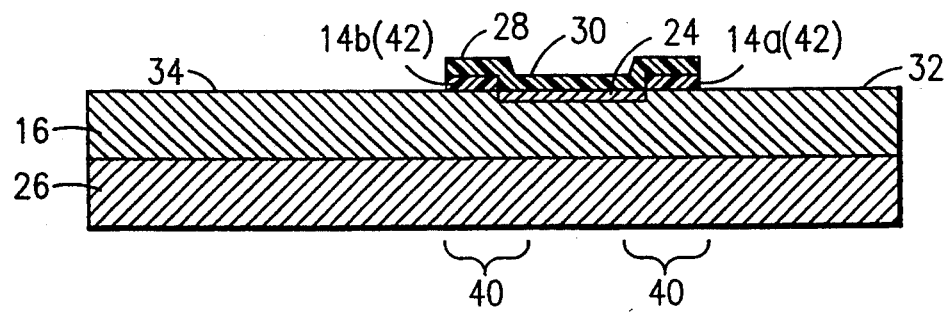

Referring now to FIG. 10, once the dielectric layer 28 has been formed, both it and the insulating segments 14A, 14B are removed from all areas that are not located in a second region 40 located on and surrounding the junction 24, to form a dielectric pad 42. The surface area of the dielectric pad 42 is substantially greater than, and in this preferred embodiment is approximately twice that, of the predetermined area of the junction 24 located in the first region 17 of the intrinsic layer 16. The removal of the insulating segments 14A, 14B and the dielectric layer 28 leave bare regions 32, 34 on the surface of the intrinsic layer 16. The formation of the dielectric pad region 42 may be accomplished by any conventional photolithography and/or etching method.

Figure 11:
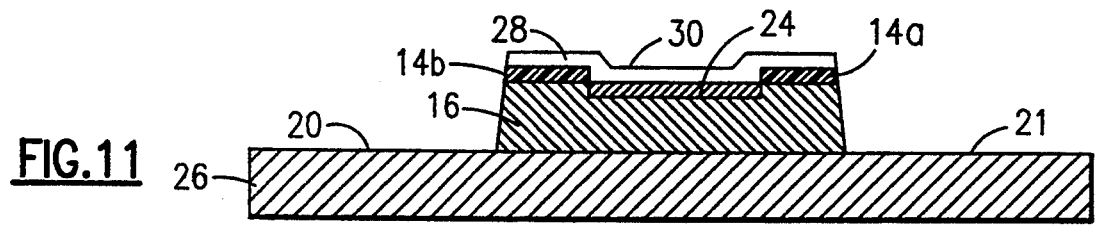

Referring now to FIG. 11, the areas of the intrinsic layer not protected by the dielectric pad region are then removed to form a mesa-structure in the intrinsic region 16. As in the previous steps, the removal of portions of the intrinsic layer not protected by the dielectric pad region can be accomplished by any conventional method including an isotropic and/or anisotropic etching with or without photolithographic or wet chemical etching. The removal of these unprotected regions exposes portions 20, 21 of the surface of the N-type substrate 26.

Figure 12:
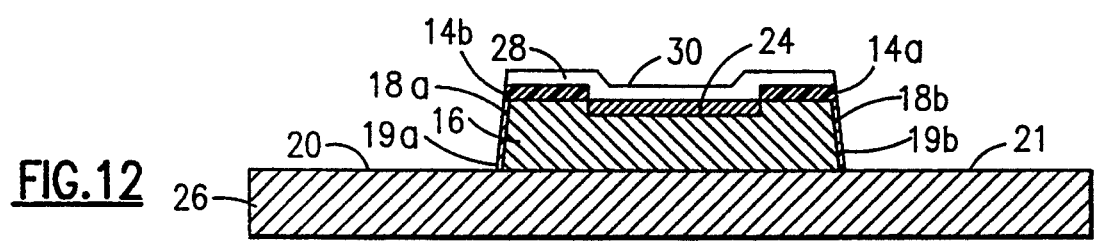

Referring now to FIG. 12, a conducting layer 19$a,b$ is formed in the side-walls 18A, 18B of the intrinsic material mesa 16 to prevent oxidation-related charge carrier recombination effects. The conducting layer is a highly doped N-type conductivity layer formed preferably by high temperature phosphorus deposition. As has been described earlier, the dopant concentration of the side-wall conducting layer is between about $10^{18}$ and about $10^{20}$ atoms per cm$^3$, and preferably has substantially the same concentration as the substrate 26. Also, preferably, the deposition of the phosphorus takes place at a temperature of about 1000° C. in an atmosphere of phosphorousoxychloride for about 30 minutes. However, this step may be performed under other conditions so long as such conditions are sufficient to effectively reduce junction diffusion, according to the instant invention.

Figure 13:
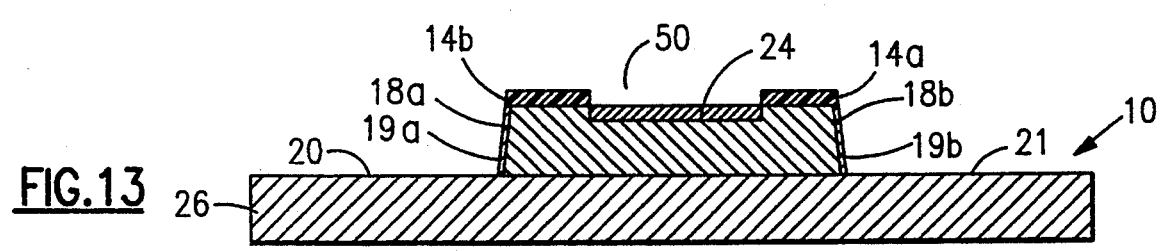

Referring to FIG. 13, the mesa 16 is then de-capped, removing the dielectric layer 28. Preferably, the removal of dielectric layer 28 is accomplished by using wet chemical methods, for example, by application of phosphoric acid having a concentration of about 87% at about 180° C. The device thus formed has as its cathode the N-type substrate 26 and as its anode the P-junction 24.

Figure 14:
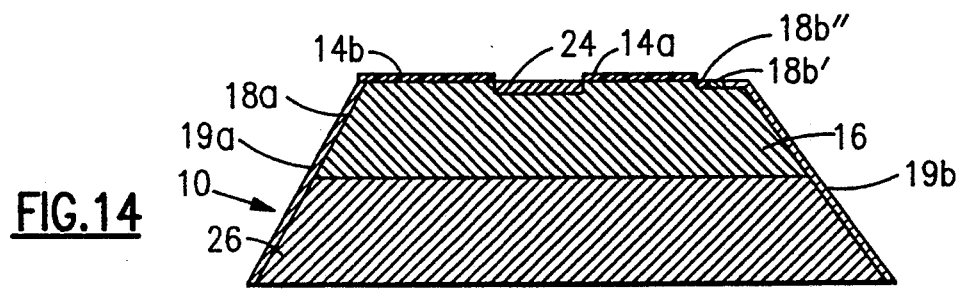
FIG. 14 illustrates a second preferred embodiment of a diode made according to the present invention.

Turning now to FIG. 14, a second embodiment of a diode according to the present invention is illustrated. In this embodiment, one 18B' or both of the N-doped side walls of the device 10 is extended and thickened so as to extend onto the top surface of the mesa structure. The extended side wall 18B' is doped so as to have substantially the same charge carrier concentration as the substrate 26. Advantageously, this causes the electrical properties of the extended side wall 18B' to be identical to those of the substrate 26. The portion of the extended side wall 18B' on the top surface of the mesa structure 18B" is disposed in a planar orientation so as to form a continuous electrical connection from the substrate 26 to the top portion 18B" of the extended side wall 18B'. Preferably, this extended side wall 18B' is formed by an additional photolithographic procedure to remove a portion of the dielectric layer 14A or by increasing the diffusion of phosphorus ions into the side wall of the intrinsic layer 16 and may be accomplished by using any of the previously discussed techniques, or other conventional diffusion methods.

Advantageously, the incorporation of an extended side wall 18B' according to the FIG. 14 embodiment allows a diode according to the present invention to be used in a wide variety of monolithic and microwave circuit applications. Furthermore, the FIG. 14 embodiment increases the number of biasing arrangements and configurations in which the diode may be used.

Figure 15:
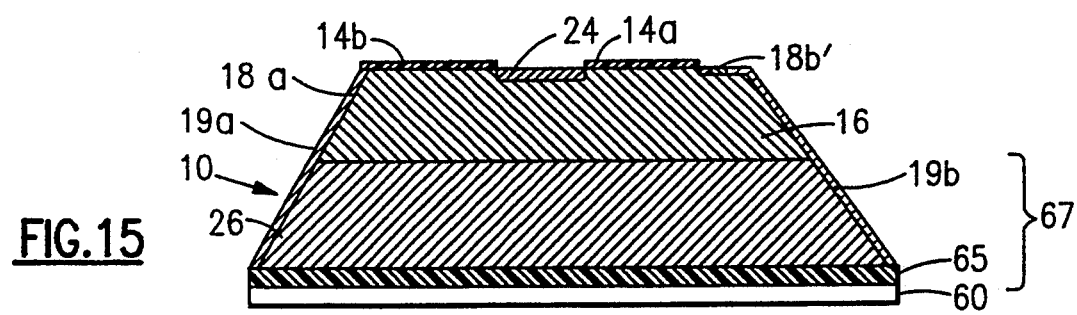
FIG. 15 depicts a modification of the embodiment illustrated in FIG. 14.

For example, as shown in FIG. 15 an integrated back side metal-nitride-semi-conductor capacitor 67 may be disposed on the bottom side of the diode 10. Capacitor 67 is comprised of the substrate 26, an electrically insulating layer 65, which may be of silicon nitride or silicon dioxide, depending on the particular application to which the device is to be put, and a conductive layer 60, in this case made of a metallic material, although other conducting materials may be used. Using an extended N-doped side wall 18B' in conjunction with bottom-formed circuit features, e.g. capacitor 67 permits a significant amount of substrate surface area to be saved.

Other advantages result from this arrangement. For example, the bottom-formed capacitor 67 may be used as a by-pass capacitor. In other words, the capacitor 67 allows small signal, high frequency (AC) components to pass through the diode 10 to ground while DC signal components are isolated from ground and allowed to pass through the diode 10 via, for example, metallizations at anode 24 and cathode 18B'.

Figure 16:
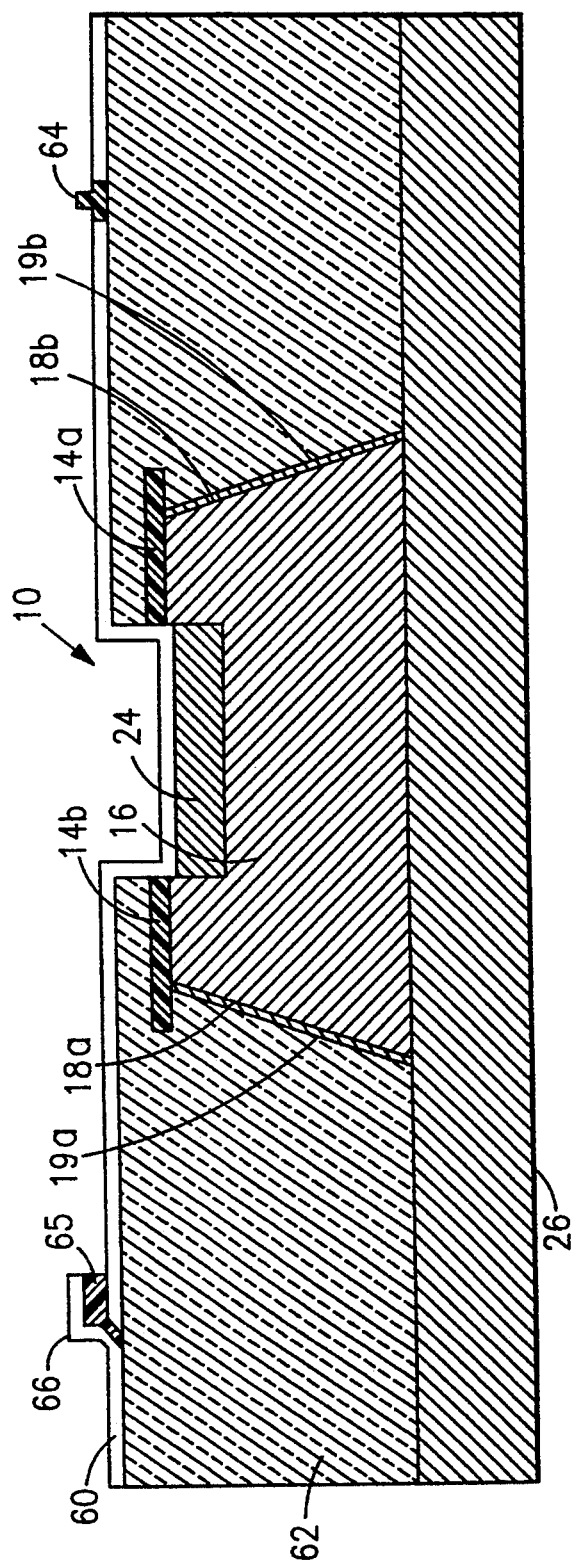
FIG. 16 depicts one preferred use to which the embodiment depicted in FIGS. 2-4 may be put.

Also, the method of the present invention advantageously may be used to fabricate a wide variety of useful integrated circuits. For example, as shown in FIG. 16, the diode made in accordance with the present invention as described above may be integrated with various components in a monolithic circuit format suitable for microwave circuit applications. In order to form the monolithic circuit depicted in FIG. 16, the process of the present invention proceeds as previously described and is followed by the encapsulation of the diode 10 with a highly insulative material 62, such as glass. The encapsulation of the diode 10 may be accomplished either by a preferred encapsulation process (which will be presently detailed) or by other appropriate encapsulation processes currently known to those skilled in the art.

Figure 17A:
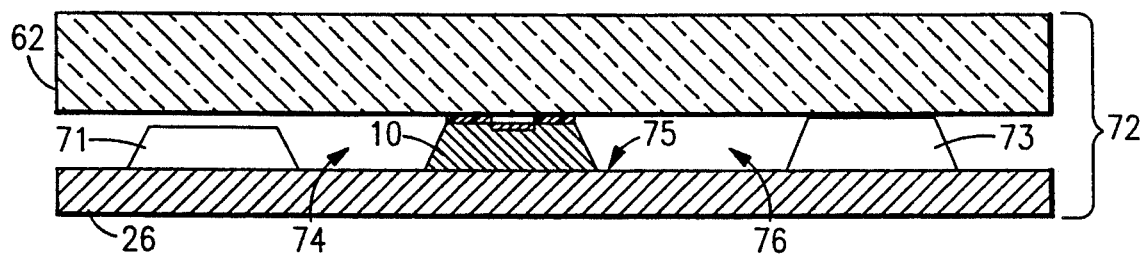
FIGS. 17A-C illustrate various stages of a preferred process for encapsulating the embodiment depicted in FIGS. 2-4 in an insulative material so that it may be put to the use depicted in FIG. 16.
Figure 17B:
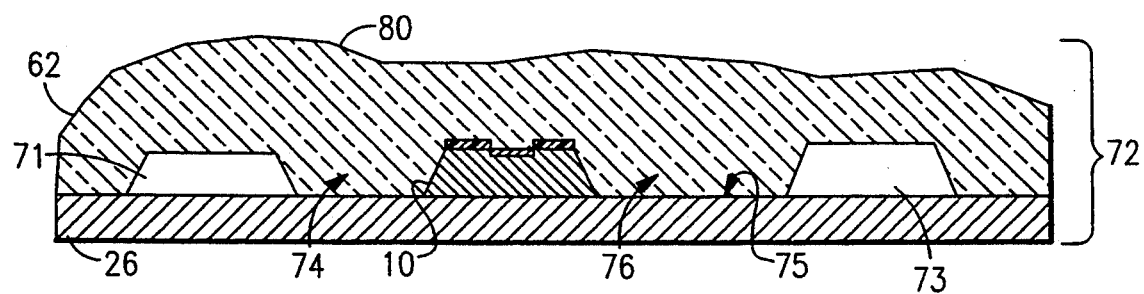
Figure 17C:
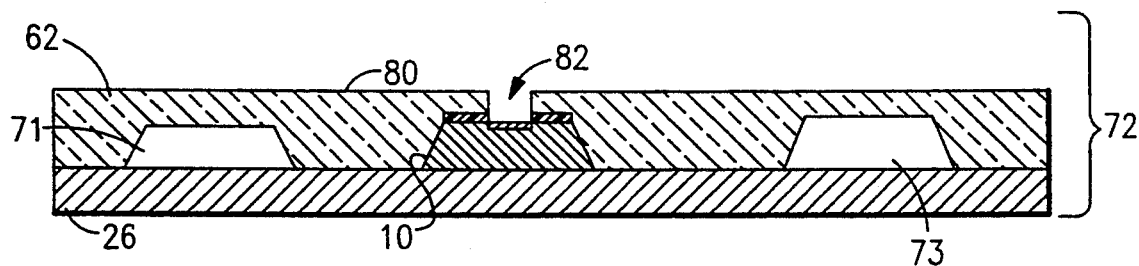

With particular reference to FIGS. 17A-C, the preferred encapsulation process will now be described. Encapsulation begins by placing a quantity of insulative material 62 (preferably, glass) in intimate contact with the diode 10, as shown in FIG. 17A. Preferably, the quantity of insulative material 62 has a wafer-like shape, a thickness of about 300 microns, and spans the diode 10, substrate 26, and any other features/components 71, 73 to be encapsulated. Of course, as will be appreciated by those skilled in the art, the type of insulative material used, as well as its shape, thickness, and thickness distribution, may vary considerably, without departing from this preferred encapsulation process of the instant invention. Next, the glass/diode composite structure 72 is subjected to ambient conditions (temperature and pressure) sufficient to cause the viscosity of the glass 62 to decrease to the point that the glass 62 flows into cavities 74, 76 of the irregularly shaped surface 75 defined by the diode 10, substrate 26, and the other features/components 71, 73 to be encapsulated, as shown in FIG. 17B. Preferably these ambient conditions are chosen such that the ambient temperature and pressure are between 750° C. and 800° C., and 0 and 5 milliTorr, respectively, for about 30 minutes. Ambient pressure is then increased (preferably at a rate of 1 atm./3 min, and until a pressure of 1 atm. is attained) so as to prevent formation of void pockets between the glass 62 and surface 75 in cavities 74, 76. Preferably, the above-described encapsulation process takes place in a vacuum furnace, or other suitable reactor vessel, whose internal environmental conditions (e.g. atmosphere, atmospheric pressure, and temperature) may be carefully controlled. Of course, although the above process is preferably used to encapsulate a diode 10 made according to the instant invention, it may also be used to encapsulate any type of component and/or feature, by appropriately modifying same in ways obvious to those skilled in the art.

Figure 18:
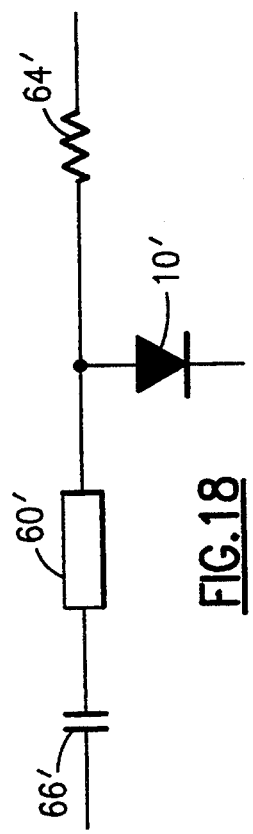
FIG. 18 illustrates the equivalent circuit of the embodiment depicted in FIG. 16.

Continuing the above discussion, after the glass 62 is permitted to harden, its top surface 80 may be ground, polished or otherwise finished to provide a smooth low-loss microstrip medium, as shown in FIG. 17C. This permits the use of fine-line photo-lithography and conventional integration techniques to incorporate passive and active circuit elements with the diode 10 and/or other components 71, 73 in a monolithic fashion. A number of passive and/or active circuit elements may then be formed on the smooth, polished surface of the glass layer 62 either before or after the metallization of that surface with a conductive layer 60, using conventional methods. For example, as shown in FIG. 16, the diode 10 (after contact opening 82 has been formed using conventional etching techniques) may be electrically connected both to a capacitive element 66 and to a resistive element 64 by means of the electrical transmission line 60. The equivalent circuit, in which corresponding elements 10, 60, 64 and 66 have been referred to in primed form 10', 60', 64' and 66' is shown in FIG. 18.

In order to illustrate that a diode made according to the present invention exhibits better charge storing capabilities than conventional diodes, a silicon PIN diode made according to FIGS. 2-4 of the present invention was subjected to various forward currents and the charge carrier lifetime in the diode's intrinsic layer was measured and compared with that of a conventional diode made in accordance with FIG. 1. The results are as follows:

EXAMPLE I

With a forward current of 10 mA, the measured charge carrier lifetime of the PIN diode made in accordance with the present invention was approximately 30 nS. A conventional PIN diode exhibits a lifetime of approximately 10 nS at 10 mA.

EXAMPLE II

With a forward current of 1 mA, the measured charge carrier lifetime of the PIN diode made in accordance with the present invention was approximately 50 nS. A conventional PIN diode exhibits a lifetime of approximately 20 nS at 1 mA.

EXAMPLE III

With a forward current of 0.1 mA, the measured charge carrier lifetime of the PIN diode made in accordance with the present invention was approximately 250 nS. A conventional PIN diode exhibits a lifetime of approximately 100 nS at 0.1 mA.

It is evident that there has been provided, in accordance with the present invention, an improved mesa-type PIN diode device and fabrication method. While the invention has been described in conjunction with specific embodiments thereof, various alternatives, modifications, and variations may be made without departing from the spirit and scope of the invention. For example, the diode of the present invention may be annealed with a forming gas so as to further reduce undesirable oxidation effects. For example, after the formation of the N-doped side walls 18A, 18B, the device may be heated to between about 300° and about 350° C. in a forming gas atmosphere for between about 10 and about 60 minutes, so as to bind traps adjacent the outer surface of the device. Other annealing methods also may be used without departing from the spirit or scope of the present invention. Also, for example, diode 10 may be formed so that the gap dimension 27 between the anode 24 and sidewalls 18A, 18B (that is, the distance 27 between the outer-edge 25 of the junction 24 and the sidewalls 18A, 18B) is essentially twice the thickness of the intrinsic region 16, so as to enhance the advantageous characteristics of a diode 10 made according to the instant invention. Accordingly, the present invention is intended to embrace all such alternatives, modifications, and variations as may fall within the spirit and broad scope of the hereinafter appended claims.

We claim:

1. A semiconductor PIN diode made by the steps of:
   a. forming an insulating layer on an intrinsic layer disposed upon an N-type substrate;
   b. forming in said insulating layer an opening to a first region of said intrinsic layer;
   c. forming in said first region a P-type junction of predetermined area;
   d. forming upon said insulating layer and said junction a dielectric layer;
   e. forming a dielectric pad region by removing both said dielectric layer and said insulating layer except in a second region located on and surrounding said junction, said second region having an area which is greater than said predetermined area of said junction;
   f. removing said dielectric layer from said second region;
   g. forming a mesa having side-walls and a top surface in said intrinsic layer beneath said pad region; and
   h. forming an N-type, highly doped conducting layer in said side-walls of said mesa.

2. A semiconductor PIN diode made according to claim 1 wherein said conducting layer is extended onto the top surface of said mesa not occupied by said junction to form an electrical contact from said substrate to the top surface of said diode.

3. A semiconductor PIN diode made according to claim 1 wherein said diode is annealed with a forming gas.

4. A semiconductor PIN diode, and comprising:
   a substrate having an N-type conductivity;
   b. an intrinsic material mesa-shaped structure disposed upon said substrate and having a top surface and side-walls;
   c. a junction formed in said top surface of said mesa-shaped structure and having an area that is less than the area of said top surface; and
   d. a highly-doped, N-type conducting layer formed in said side-walls of said mesa-shaped structure.

5. A diode according to claim 4, wherein said conducting layer is doped with phosphorous.

6. A diode according to claim 4, wherein said conducting layer extends onto the top surface of said mesa not occupied by said junction to form an electrical contact from said substrate to the top surface of said diode.

7. A semiconductor PIN diode, and comprising:
   a. an N-type silicon substrate;
   b. an intrinsic material mesa-shaped structure epitaxially disposed upon said substrate and including a top surface and side-walls;
   c. a P-type junction formed in said top surface of said mesa-shaped structure and having an area that is approximately half the area of said top surface;
   d. a $SiO_2$ insulating layer disposed upon said top surface without covering said junction; and
   e. an N-type, phosphorous-doped silicon conducting layer formed in said side-walls of said mesa-shaped structure, said conducting layer extending onto the top surface of said mesa not occupied by said junction to form an electrical contact from said substrate to the top surface of said diode.

8. A diode according to claim 4, and further comprising, an insulative material encapsulating said diode.

9. A diode according to claim 8, wherein said insulative material is a glass.

10. A diode according to claim 8, wherein said insulative material is finished to substantial planarity so as to provide at least one substantially smooth surface suitable for forming additional circuit elements therein.

11. A diode according to claim 7, and further comprising, an integrated back side capacitor formed on the side of said substrate not having said mesa-shaped structure disposed thereon.

12. A diode according to claim 11, wherein said capacitor comprises an electrically insulating layer sandwiched between said substrate and another conducting layer.

13. A diode according to claim 4, wherein the area of said top surface is approximately twice the area of said junction.

14. A diode according to claim 4, wherein said diode has a gap dimension between said sidewalls and said junction that is approximately twice the thickness of said intrinsic material structure.

* * * * *

UNITED STATES PATENT AND TRADEMARK OFFICE
CERTIFICATE OF CORRECTION

PATENT NO. : 5,343,070
DATED : August 30, 1994
INVENTOR(S) : Goodrich et al.

It is certified that error appears in the above-indentified patent and that said Letters Patent is hereby corrected as shown below:

Claim 4, Col. 9, Line 43  "a substrate" should be -- a. a substrate --

Signed and Sealed this

Fourth Day of April, 1995

Attest:

BRUCE LEHMAN

*Attesting Officer*          *Commissioner of Patents and Trademarks*